United States Patent
Ohashi et al.

(10) Patent No.: US 10,159,170 B2
(45) Date of Patent: Dec. 18, 2018

(54) FEEDER

(71) Applicant: FUJI CORPORATION, Chiryu-shi (JP)

(72) Inventors: Hiroyasu Ohashi, Toyota (JP); Koichiro Sugimoto, Anjo (JP); Akira Takahashi, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/554,110

(22) PCT Filed: Mar. 9, 2015

(86) PCT No.: PCT/JP2015/056851
§ 371 (c)(1),
(2) Date: Aug. 28, 2017

(87) PCT Pub. No.: WO2016/143041
PCT Pub. Date: Sep. 15, 2016

(65) Prior Publication Data
US 2018/0042151 A1 Feb. 8, 2018

(51) Int. Cl.
*H05K 13/04* (2006.01)
*B65H 20/20* (2006.01)
*H05K 13/02* (2006.01)
*H05K 13/00* (2006.01)

(52) U.S. Cl.
CPC ......... *H05K 13/0417* (2013.01); *B65H 20/20* (2013.01); *H05K 13/003* (2013.01); *H05K 13/02* (2013.01); *H05K 13/021* (2013.01)

(58) Field of Classification Search
CPC ..... B65H 20/20; B65H 20/22; H05K 13/0417
See application file for complete search history.

(56) References Cited

U.S. PATENT DOCUMENTS

| 4,586,670 A | 5/1986 | Vancelette et al. |
| 2003/0049109 A1* | 3/2003 | Yman .................. H05K 13/02 414/403 |
| 2011/0072654 A1 | 3/2011 | Oyama et al. |

(Continued)

FOREIGN PATENT DOCUMENTS

JP   2011-077096 A   4/2011

OTHER PUBLICATIONS

International Search Report dated Apr. 14, 2015 in PCT/JP2015/056851 filed Mar. 9, 2015.

(Continued)

*Primary Examiner* — Michael C McCullough
(74) *Attorney, Agent, or Firm* — Oblon, McClelland, Maier & Neustadt, L.L.P.

(57) ABSTRACT

A groove for allowing passing of a component storage section during conveyance of a carrier tape having the component storage section protruding is formed in a tape conveyance path of a feeder. The groove is provided with a tape lower face biasing member which is pressed by the lower face of the carrier tape and is deformed downward when the carrier tape has the component storage section protruding until the carrier tape inserted from a tape insertion section reaches a rear side sprocket, and biases the lower face of the carrier tape when the carrier tape has the component storage section not protruding.

5 Claims, 9 Drawing Sheets

(56) References Cited

U.S. PATENT DOCUMENTS

| | | | |
|---|---|---|---|
| 2012/0285628 A1 | 11/2012 | Katsumi et al. | |
| 2015/0223371 A1* | 8/2015 | Kanai | H05K 13/02 |
| | | | 226/76 |
| 2017/0259589 A1* | 9/2017 | Matsumori | B41J 13/0009 |
| 2018/0160576 A1* | 6/2018 | Ohashi | H05K 13/02 |

OTHER PUBLICATIONS

European Search Report issued in European Patent Application No. 15884537.0 dated Sep. 20, 2018.

* cited by examiner

FEEDER

TECHNICAL FIELD

The present disclosure relates to a feeder for conveying a carrier tape in which a component is stored.

BACKGROUND ART

PTL 1 discloses an auto-loading type feeder including a tape detection sensor that detects the presence or absence of a carrier tape inserted into a tape insertion section. The tape detection sensor includes a V-shaped plate spring biased toward a tape conveyance path, and a light sensor for which a light path can be shielded by a light path shielding plate provided at the center of the plate spring. With the tape detection sensor, light is shielded from the light sensor or incident on the light sensor by the carrier tape moving the plate spring up and down, and thus it is possible to detect the presence or absence of the carrier tape.

CITATION LIST

Patent Literature

PTL 1: JP-A-2011-77096

SUMMARY

There is known an auto-loading type feeder capable of supplying a carrier tape (hereinafter, referred to as an embossed tape) which includes not only a carrier tape (hereinafter, referred to as a carrier tape) capable of storing a relatively small-sized component but also a component storage section capable of storing a relatively large-sized component and protruding downward. A groove for allowing passing of the component storage section of the embossed tape is formed in the tape conveyance path of such a feeder.

In the tape conveyance path, if the carrier tape is easily bent during the conveyance of the carrier tape, one side portion of the carrier tape may fall into the groove. In this case, the carrier tape does not raise the plate spring of the tape detection sensor, and thus the light sensor of the tape detection sensor cannot detect a tape, which results in a problem in that it is not possible to start the operation of auto-loading.

The disclosure is contrived in view of such a problem, and an object thereof is to provide a feeder capable of reliably performing auto-loading on various tapes.

In order to solve the above described problem, a feeder of the disclosure includes a feeder main body which has a tape insertion section formed in a rear portion of the feeder main body, the tape insertion section being configured to receive a carrier tape in which a component storage section storing multiple components is formed so as to protrude downward and a carrier tape in which a component storage section not protruding downward is formed, a tape conveyance path which is provided between both side walls of the feeder main body so as to communicate with the tape insertion section in order to convey the carrier tapes toward a front side from a back side, and a rear side sprocket which is rotatably provided in the feeder main body, has an engageable engagement protrusion in an engagement hole of the carrier tape inserted from the tape insertion section, and transmits the carrier tape along the tape conveyance path, in which a groove for allowing passing of the component storage section during the conveyance of the carrier tape having the component storage section protruding is formed in the tape conveyance path, and in which the groove is provided with a tape lower face biasing member which is pressed by a lower face of the carrier tape and is deformed downward when the carrier tape has the component storage section protruding, and biases the lower face of the carrier tape when the carrier tape has the component storage section not protruding, until the carrier tape inserted from the tape insertion section reaches the rear side sprocket.

Thereby, even when the carrier tape having the component storage sect ion not protruding is easily bent, the lower face of the carrier tape is supported by the tape lower face biasing member when the carrier tape is inserted into the tape conveyance path from the tape insertion section. Accordingly, it is possible to prevent one side portion of the carrier tape from falling into the groove of the tape conveyance path.

DESCRIPTION OF EMBODIMENTS

Configuration of Component Mounting Machine

Figure 1:
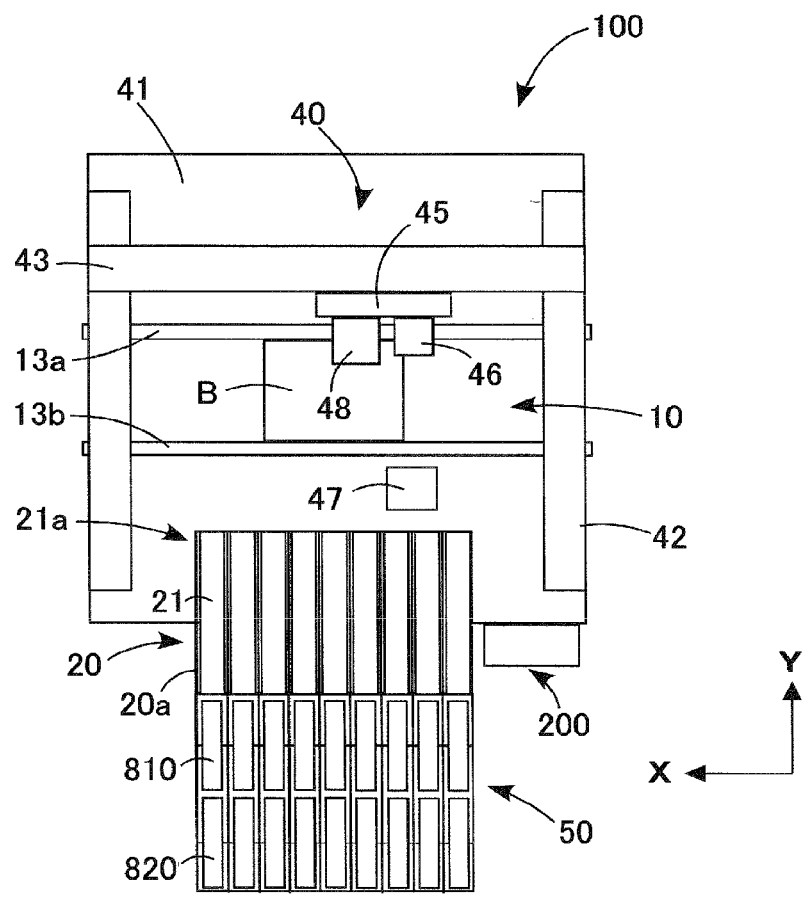
FIG. 1 is a plan view illustrating the entire component mounting machine which is suitable for the implementation of the disclosure.

Hereinafter, an embodiment of the disclosure will be described with reference to the accompanying drawings. FIG. 1 illustrates component mounting machine 100 including feeder 21, and component mounting machine 100 includes board conveyance section 10, component supply section 20, component mounting section 40, reel holding section 50, and control device 200 that controls these sections. Meanwhile, in the following description, a conveyance direction of a board is set to be an X-axis direction, and a horizontal direction perpendicular to the X-axis direction is set to be a Y-axis direction.

As illustrated in FIG. 1, component supply section 20 includes multiple slots 20a, and multiple feeders 21 that are detachably mounted into the respective slots 20a. The multiple slots 20a are provided in component supply section 20 in parallel in the X-axis direction.

Reel holding section 50 exchangeably holds a first reel 810 and a second reel 820 which are wound with carrier tape 900 (see FIGS. 2 and 3A) or embossed tape 910 to be described later (see FIGS. 2 and 3B). One first reel 810 and one second reel 820 are disposed in parallel in the Y-direction, and the multiple first reels and multiple second reels corresponding to the respective feeders 21 are disposed in the X-direction.

Although details will be described later, carrier tape 900 or embossed tape 910 which is wound around the first reel 810 and the second reel 820 can be inserted into each feeder 21. Carrier tape 900 or embossed tape 910 which is wound around one reel 810 (820) is sequentially conveyed to component pickup positions 21a, which are respectively provided at the tip end portions of feeders 21, by feeders 21. Thereby, a component held by carrier tape 900 or embossed tape 910 is positioned at component pickup position 21a. In addition, carrier tape 900 or embossed tape 910 which is wound around the other reel 820 (810) stands by without being fed by the feeder 21.

Meanwhile, hereinafter, for convenience of description, in order to distinguish between carrier tape 900 or embossed tape 910 in a conveyed (used) state and carrier tape 900 or embossed tape 910 in a standby state, the former tape may be referred to as a first carrier tape 900A or a first embossed tape 910A and the latter tape may be referred to as a second carrier tape 900B or a second embossed tape 910B. In this case, the second carrier tape or the second embossed tape changes to the first carrier tape or the first embossed tape after all of the components stored in the first carrier tape or the first embossed tape are used; the first carrier tape or the first embossed tape and the second carrier tape or the second embossed tape do not indicate a specific carrier tape or embossed tape.

Figure 2:
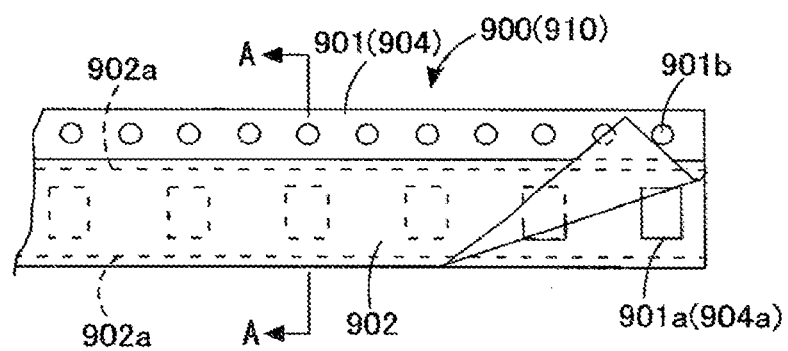
FIG. 2 is a top view of a carrier tape and an embossed tape.
Figure 3A:
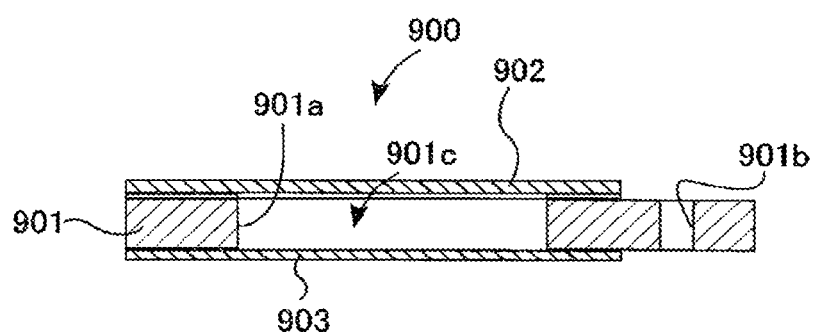
FIG. 3A is a cross-sectional view taken along line A-A of the carrier tape illustrated in FIG. 2.
Figure 3B:
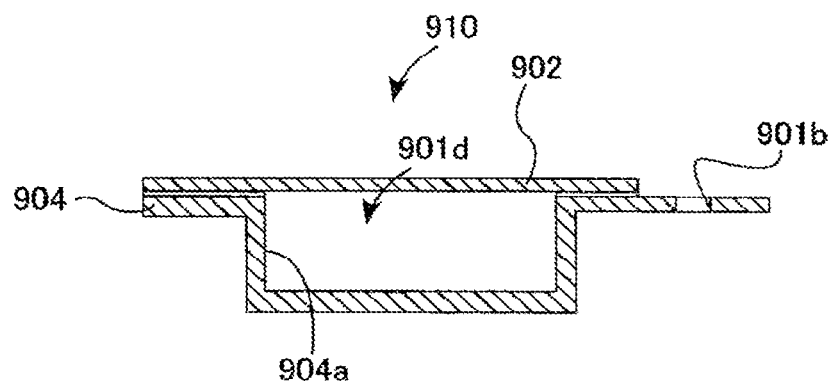
FIG. 3B is a cross-sectional view taken along line A-A of the embossed tape illustrated in FIG. 2.

As illustrated in FIGS. 2, 3A, and 3B, components such as multiple electronic components are stored in carrier tape 900 and embossed tape 910 in a row. Carrier tape 900 includes base tape 901, cover tape 902, and bottom tape 903. Embossed tape 910 includes base tape 904 and cover tape 902. Each of the base tapes 901 and 904 is formed of a flexible material such as a paper material or a resin. Through holes 901a are formed in the central portion of base tape 901 of carrier tape 900 in the width direct ion at fixed intervals in the longitudinal direction. Embossed sections 904a recessed downward are formed in the central portion of base tape 904 of embossed tape 910 in the width direction at fixed intervals in the longitudinal direction. Engagement holes 901b are formed so as to penetrate the side portions of base tapes 901 and 904 at fixed intervals in the longitudinal direction.

As illustrated in FIG. 3A, carrier tape 900 stores a relatively small-sized component, and thus bottom tape 903 is formed so as to be flat, and the component is stored in a component storage section 901c formed between bottom tape 903, through hole 901a of base tape 901, and cover tape 902. In addition, as illustrated in FIG. 3B, embossed tape 910 stores a relatively large-sized component, and thus the component is stored in component storage section 901d formed between embossed section 904a of base tape 904 and cover tape 902.

As illustrated in FIG. 2, both side portions of cover tape 902 are bonded to both side portions of the upper faces of base tapes 901 and 904 by adhesive 902a, and cover tape 902 normally blocks the upper portions of component storage sections 901c and 901d. Cover tape 902 prevents components stored in the storage sections 901c and 901d from coming out. Cover tape 902 is constituted toy a transparent polymer film. In addition, as illustrated in FIG. 3A, bottom tape 903 is bonded to the lower face of base tape 901 of carrier tape 900. Bottom tape 903 prevents a component stored in component storage section 901c from falling. Bottom tape 903 is constituted by a transparent or semitransparent paper material, a polymer film, or the like.

As illustrated in FIG. 1, in board conveyance section 10, a pair of guide rails 13a and 13b are provided on base 41 of component mounting section 40. In addition, board conveyance section 10 is provided with a conveyor belt, not shown in the drawing, which supports and transports a board B guided by the guide rails 13a and 13b, and a clamping device, not shown in the drawing, which raises and clamps the board B transported to a predetermined position. The board B having a component mounted thereon is transported to a component mounting position in the X-axis direction by the conveyor belt while being guided by the guide rails 13a and 13b of board conveyance section 10. The board B conveyed to the component mounting position is positioned and clamped at the component mounting position by the clamping device.

Component mounting section 40 includes guide rail 42, Y-axis slide 43, X-axis slide 45, and component mounting head 48 that holds a suction nozzle not shown in the drawing. The movements of Y-axis slide 43 and X-axis slide 45 in the Y-axis direction and X-axis direction are controlled by a Y-axis servomotor and an X-axis servomotor not shown in the drawing. A Y-axis robot is constituted by guide rail 42 and Y-axis slide 43. Guide rail 42 is mounted on base 41 in the Y-axis direction and is disposed above board conveyance section 10. Y-axis slide 43 is provided along guide rail 42 so as to be movable in the Y-axis direction. Y-axis slide 43 is moved in the Y-axis direction through a ball screw mechanism by a Y-axis servomotor not shown in the drawing.

An X-axis robot is constituted by X-axis slide 45. X-axis slide 45 is provided on Y-axis slide 43 so as to be movable in the X-axis direction. Y-axis slide 43 is provided with an X-axis servomotor not shown in the drawing. X-axis slide 45 is moved in the X-axis direction by the X-axis servomotor through the ball screw mechanism. X-axis slide 45 is provided with component mounting head 48. Component mounting head 48 detachably holds multiple suction nozzles (not shown). The suction nozzle sucks a component transported to component pickup position 21a and mounts the component on the board B which is positioned at a component mounting position by board conveyance section 10.

Board camera 46 is installed on X-axis slide 45. Board camera 46 captures an image of a fiducial mark provided in the board B positioned at a board mounting position, a component conveyed to component pickup position 21a, or the like from above to acquire board position reference information, component positional information, and the like. In addition, component camera 47 capable of capturing an image of the component, sucked by the suction nozzle, from below is provided on base 41.

Control device 200 controls feeder 21, and controls the rotation of a first servomotor 22 and a second servomotor 23 of feeder 21 which are to be described later. Control device 200 includes a microprocessor and a driver that supplies a driving current to servomotors 22 and 23. When feeder 21 is mounted in slot 20a of component supply section 20, power is supplied to the feeder 21 side from the main body side of the component mounting machine 100 through a communication connector not shown in the drawing, and necessary information such as a feeder ID is transmitted to control device 200 of component mounting machine 100 from the feeder 21 side. Thereby, information of a component transmitted by carrier tape 900 loaded in feeder 21 is acquired on the basis of a serial ID of feeder 21, and is stored in control device 200.

Configuration of Feeder

Next, a configuration of feeder 21 will be described with reference to FIGS. 4 to 7. Feeder 21 mainly includes feeder main body 21b, rail 38 as a tape conveyance path, inlet pressing member 32, a first sprocket 61 and a second sprocket 62 as front side sprockets, a third sprocket 63 and a fourth sprocket 64 as rear side sprockets, and the like. Meanwhile, FIGS. 4 and 5 illustrate a state where one side wall 21ba (on the back side of FIGS. 4 and 5) of feeder main body 21b (see FIG. 7) is left and the other side wall 21bb (on the front side of FIGS. 4 and 5) (see FIG. 7) is removed so that the internal structure of feeder 21 can be viewed.

Figure 4:
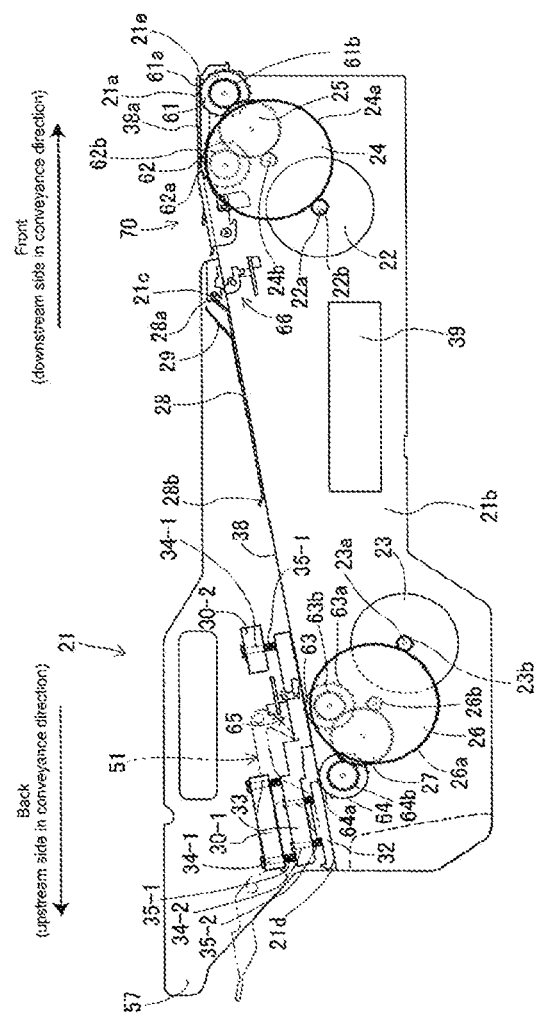
FIG. 4 is a side view of a feeder according to an embodiment of the disclosure.
Figure 5:
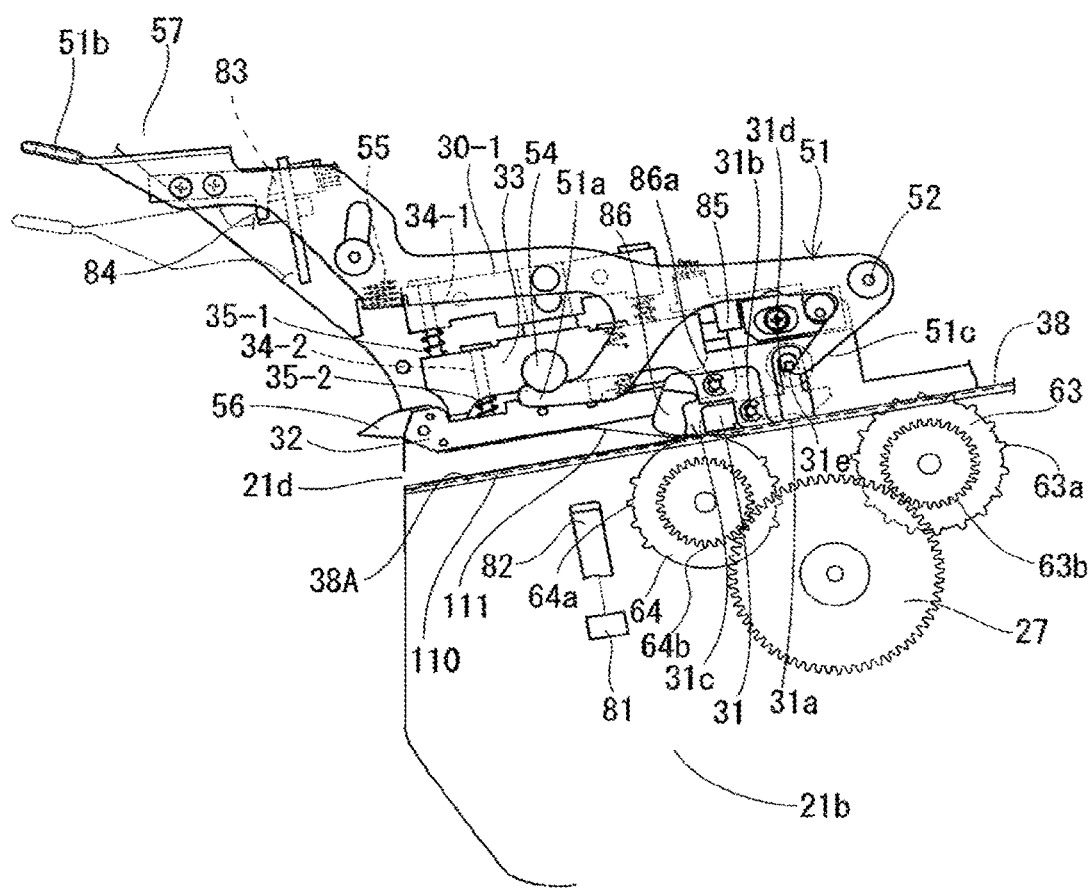
FIG. 5 is an enlarged view of a rear portion of the feeder illustrated in FIG. 4.

As illustrated in FIG. 4, feeder main body 21b has a flat box shape. Tape insertion section 21d for receiving carrier tape 900 or embossed tape 910 is formed in the rear portion of feeder main body 21b, and tape discharging section 21e for discharging carrier tape 900 or embossed tape 910 is formed in the front portion. Tape insertion section 21d is formed as an inlet of tape conveyance path 38 having the same width as the width of tape conveyance path (rail) 38, and tape discharging section 21e is formed as an outlet of tape conveyance path 38 having the same width as the width of tape conveyance path 38.

Tape conveyance path 38 is provided between both the side walls 21ba and 21bb of feeder main body 21b so as to communicate with tape insertion section 21d and tape discharging section 21e in order to transport carrier tape 900 or embossed tape 910 toward the front side of feeder main body 21b from the back side thereof. Front portion 38a of tape conveyance path 38 is horizontally formed. In this embodiment, tape conveyance path 38 is inclined so as to be gradually raised from the rear portion thereof to the front of front portion 38a. Meanwhile, although not shown in the drawing, both sides of tape conveyance path 38 are respectively provided with guide sections separated from each other at a dimension slightly larger than the dimension of the width of carrier tape 900 (embossed tape 910).

As illustrated in FIGS. 4 to 7, groove 38A for allowing passing of component storage section 91d of embossed tape 910 is formed in tape conveyance path 38. Tape lower face biasing member 110 configured by a belt-shaped plate spring (elastic body) extending to stopper member 31 to be described later from tape insertion section 21d is provided in groove 38A. Tape lower face biasing member 110 is disposed along an upper edge of groove 38A at a position slightly higher than the upper edge, and is configured such that the front end portion thereof is bent downward in an L shape so that the tip end portion thereof is fixed to the bottom face of groove 38A by a spring, not shown in the drawing, or the like and the rear end portion thereof is slightly bent downward at a free end. The reason why the rear end portion is bent downward is because a tape tip end inserted into tape conveyance path 38 is smoothly guided to the upper face of tape lower face biasing member 110 without abutting against the rear end portion of tape lower face biasing member 110.

Tape lower face biasing member 110 has a cantilever structure as described above. Accordingly, in a case where a tape inserted into tape conveyance path 38 from tape insertion section 21d is carrier tape 900, the lower face of bottom tape 903 is biased upward until the tip end portion of carrier tape 900 reaches fourth sprocket 64 (see FIG. 11). In addition, in a case where the tape inserted into tape conveyance path 38 from tape insertion section 21d is embossed tape 910, tape lower face biasing member 110 is deformed by being pressed downward on the lower face of embossed section 904a of bottom tape 904 until the tip end portion of embossed tape 910 reaches fourth sprocket 64 (see FIG. 13).

As illustrated in FIGS. 4 and 5, inlet pressing member 32, pressing carrier tape 900 or embossed tape 910 which is inserted from tape insertion section 21d toward tape conveyance path 38, which is disposed along the rear portion upper face of tape conveyance path 38 in proximity to tape insertion section 21d, and which is provided so as to separate from or come into contact with tape conveyance path 38. Inlet pressing member 32 is installed downward from the rear portion of downstream side pressing member 33 through a pair of shafts 34-2 so as to be movable in an up-down direction. Spring 35-2 biasing inlet pressing member 32 downward is installed in each of the pair of shafts 34-2.

As illustrated in FIGS. 4 to 7, tape upper face biasing member 111 which is a belt-shaped plate spring (elastic body) extending to the front of an arrangement position of third dog 86 (equivalent to a "detection device" of the disclosure) to be described later is provided on the lower face of inlet pressing member 32 so as to face tape lower face biasing member 110. Tape upper face biasing member 111 is configured such that the rear end portion thereof is fixed to the lower face of inlet pressing member 32 by a spring, not shown in the drawing, or the like, the front end portion thereof is bent downward in an L shape, and the tip end portion thereof abuts against tape lower face biasing member 110 as a free end.

Since tape upper face biasing member 111 has a cantilever structure as described above, the tape upper face biasing member is inserted into tape conveyance path 38 from tape insertion section 21d and biases the upper face of carrier tape 900 or embossed tape 910 passing over tape lower face biasing member 110. That is, the tip end of carrier tape 900 or the embossed tape 910 pushes up tape upper face biasing member 111 abutting against tape lower face biasing member 110, and enters between tape lower face biasing member 110 and tape upper face biasing member 111. Thereby, tape upper face biasing member 111 biases the upper face of carrier tape 900 or embossed tape 910 downward.

Figure 15:
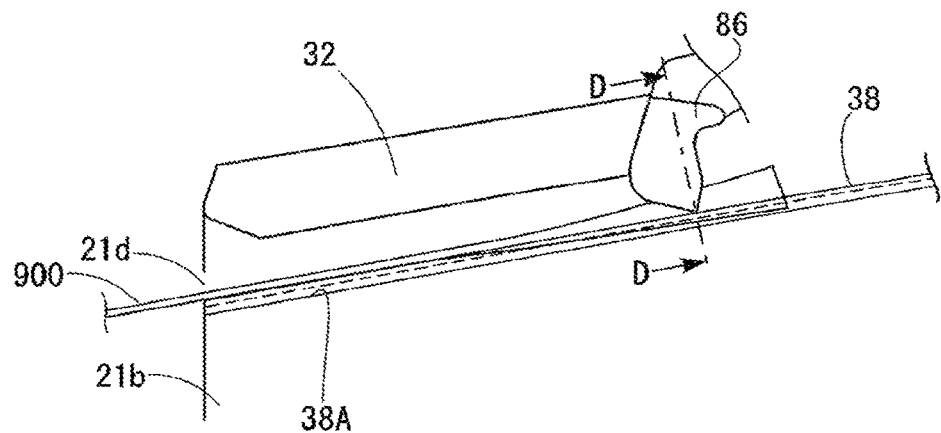
FIG. 15 is a diagram illustrating a state when a carrier tape is inserted into a tape conveyance path of the related art.
Figure 16:
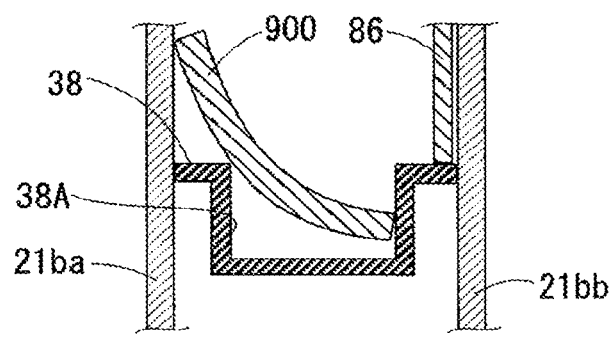
FIG. 16 is a cross-sectional view taken along line D-D in the vicinity of the tape conveyance path illustrated in FIG. 15.

Here, as described in the background art section, when carrier tape 900 is easily bent, carrier tape 900 is twisted in the width direction as illustrated in FIG. 15 when carrier tape 900 is inserted into tape conveyance path 38 from tape insertion section 21d, and one side portion of carrier tape 900 may fall into groove 38A of tape conveyance path 38 as illustrated in FIG. 16. In this state, it is not possible to rotate third dog 86 due to the tip end of carrier tape 900 abutting against third dog 86, and to detect that carrier tape 900 has been inserted into a predetermined position by third sensor 85 (see FIG. 5) (equivalent to a "detection device" of the disclosure) to be described later.

Figure 6:
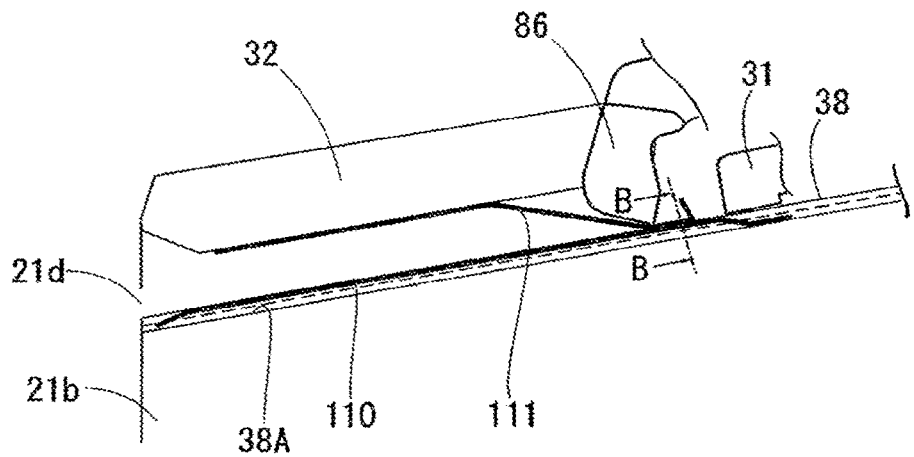
FIG. 6 is a detailed enlarged view in the vicinity of a tape lower face biasing member and a tape upper face biasing member illustrated in FIG. 5.
Figure 7:
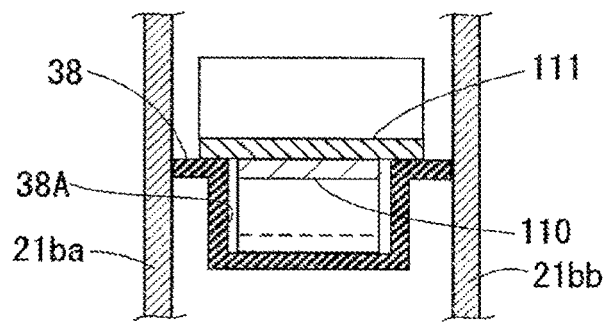
FIG. 7 is a cross-sectional view taken along line B-B in the vicinity of the tape lower face biasing member and the tape upper face biasing member illustrated in FIG. 6.
Figure 8:
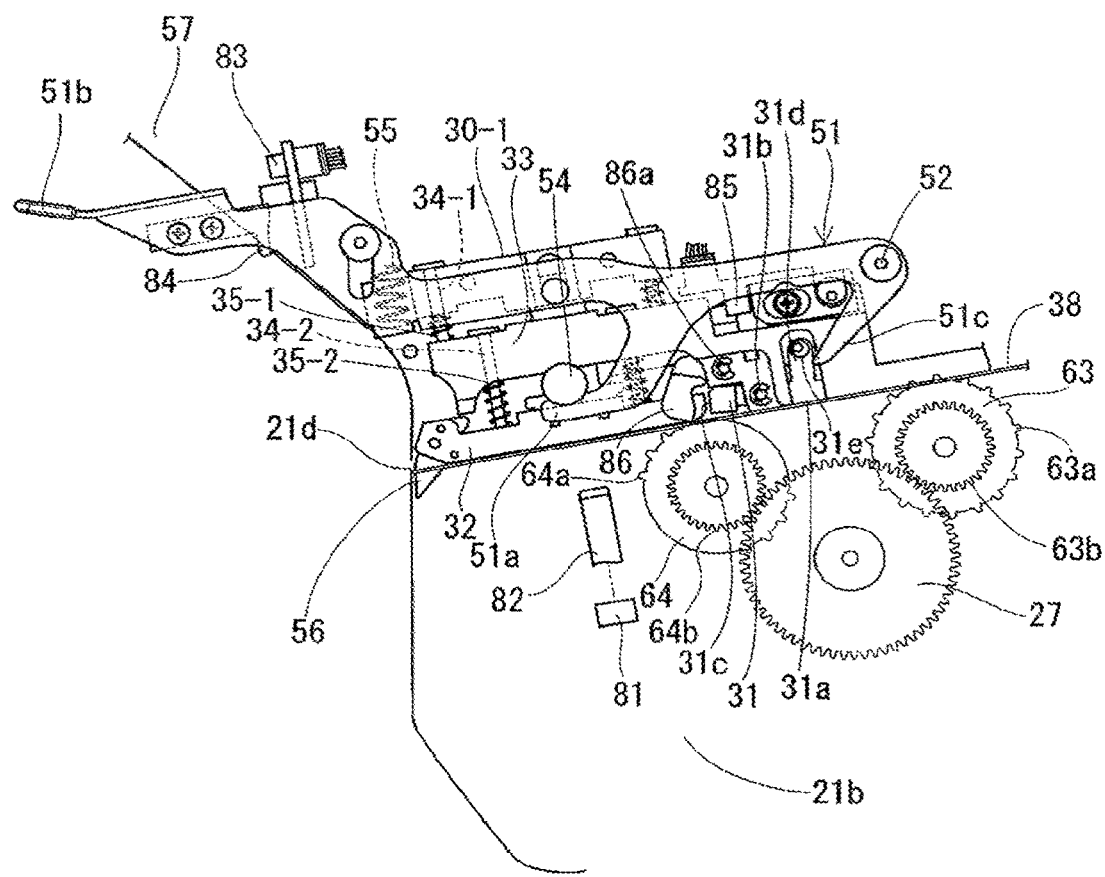
FIG. 8 is an operational state diagram illustrating a state before the feeder is operated and a state where an operation lever is lowered.

However, in this embodiment, as illustrated in FIGS. 6 and 7, tape lower face biasing member 110 is provided within groove 38A of tape conveyance path 38, and tape upper face biasing member 111 is provided on the lower face of inlet pressing member 32. Thereby, even when carrier tape 990 is easily bent, carrier tape 900 is configured such that the upper and lower faces thereof are sandwiched between tape lower face biasing member 110 and tape upper face biasing member 111 when carrier tape 900 is inserted into tape conveyance path 38 from tape insertion section 21d.

Accordingly, one side portion of carrier tape 900 can be prevented from falling into groove 38A of tape conveyance path 38, and embossed tape 910 can smoothly move on tape conveyance path 38. Thus, it is possible to rotate third dog 86 by the tip end of carrier tape 900 or embossed tape 910 abutting against third dog 86 and to detect that carrier tape 900 or embossed tape 910 has been inserted into a predetermined position by third sensor 85.

As described above, carrier tape 900 needs to move along the upper face of tape conveyance path 38 without being lifted from the upper face when the upper and lower faces of the carrier tape are sandwiched between tape lower face biasing member 110 and tape upper face biasing member 111. In addition, embossed tape 910 needs to move along the upper face of tape conveyance path 38 without being lifted from the upper face in a state where tape lower face biasing member 110 is deformed downward by embossed section 904a when the upper and lower faces of the carrier tape are sandwiched between tape lower face biasing member 110 and tape upper face biasing member 111. For this reason, tape lower face biasing member 110 is formed so as to have an elastic modulus lower than the elastic modulus of tape upper face biasing member 111.

As illustrated in FIGS. 4 and 5, downstream side pressing member 33, pressing carrier tape 900 or embossed tape 910 on the downstream side of inlet pressing member 32, is provided so as to separate from or come into contact with tape conveyance path 38. Downstream side pressing member 33 is installed in first supporting member 30-1 and second supporting member 30-2 installed in feeder main body 21b so as to be movable in an up-down direction through shaft 34-1. Spring 35-1 biasing downstream side pressing member 33 downward is installed in shaft 34-1.

As illustrated in FIG. 4, first sprocket 61 and second sprocket 62 are provided in feeder main body 21b below front portion 38a of tape conveyance path 38, that is, at a position adjacent to component pickup position 21a of feeder main body 21b so as to be rotatable toward the back side from the front side (from the downstream side in the conveyance direction to the upstream side). Third sprocket 63 and fourth sprocket 64 are provided in feeder main body 21b below the rear portion of tape conveyance path 38 so as to be rotatable toward the back side from the front side.

Engagement protrusions 61a, 62a, and 63a are formed on the respective outer circumferences of first sprocket 61, second sprocket 62, and third sprocket 63 at a fixed angle over the entire circumference. Engagement protrusions 64a are provided on a portion of the outer circumference of fourth sprocket 64 at an interval of 180 degrees. That is, a portion having no engagement protrusion formed therein is present between engagement protrusions 64a of fourth sprocket 64. Each of the engagement protrusions 61a to 64a is engageable with engagement hole 901b of carrier tape 900 or embossed tape 910.

First sprocket gear 61b, second sprocket gear 62b, third sprocket gear 63b, and fourth sprocket gear 64b are formed further inside than the outer circumferential portions of first sprocket 61 to fourth sprocket 64. Meanwhile, window holes, not shown in the drawing, are provided above the respective sprockets 61 to 64 of tape conveyance path 38, and the engagement protrusions 61a to 64a enter into tape conveyance path 38 via the window holes.

First servomotor 22 is a motor that rotates first sprocket 61 and second sprocket 62. Rotation shaft 22a of first servomotor 22 is provided with first drive gear 22b. First gear 24 is rotatably provided in feeder main body 21b below first sprocket 61 and second sprocket 62. First outer gear 24a meshing with first drive gear 22b is formed on the outer circumference of first gear 24. First inner gear 24b is formed further inside the outer circumference of first gear 24.

Second gear 25 is rotatably provided in feeder main body 21b between first sprocket 61, second sprocket 62, and first gear 24. Second gear 25 meshes with first sprocket gear 61b, second sprocket gear 62b, and first inner gear 24b. With such a configuration, the rotation of first servomotor 22 is decelerated and transmitted to first sprocket 61 and second sprocket 62, and first sprocket 61 and second sprocket 62 are rotated in synchronization with each other.

Second servomotor 23 is a motor that rotates third sprocket 63 and fourth sprocket 64. Rotation shaft 23a of second servomotor 23 is provided with second drive gear 23b. Third gear 26 is rotatably provided in feeder main body 21b below third sprocket 63 and fourth sprocket 64. Third outer gear 26a meshing with second drive gear 23b is formed on the outer circumference of third gear 26. Third inner gear 26b is formed further inside than the outer circumference of third gear 26.

Fourth gear 27 is rot at ably provided in feeder main body 21b between third sprocket 63, fourth sprocket 64, and third gear 26. Fourth gear 27 meshes with third sprocket gear 63b, fourth sprocket gear 64b, and third inner gear 26b. With such a configuration, the rotation of second servomotor 23 is decelerated and transmitted to third sprocket 63 and fourth sprocket 64, and third sprocket 63 and fourth sprocket 64 are rotated in synchronization with each other.

As illustrated in FIG. 5, operation lever 51 is provided so as to protrude backward above tape insertion section 21d of the rear portion of feeder main body 21b, and is rotatably supported centering on pivot 52. Lever operation gripping section 57 (see FIG. 4) is formed so as to protrude backward from the rear portion of feeder main body 21b above operation lever 51. Operation lever 51 is provided such that the pivot 52 side is accommodated in lever operation gripping section 57 and an operation knob 51b side protrudes from lever operation gripping section 57 so that an operator easily operates operation knob 51b by their finger while gripping lever operation gripping section 57 with their palm.

Inlet pressing member 32 is operationally connected to operation lever 51 as described later. Inlet pressing member 32 is provided with engagement member 54 between the pair of shafts 34-2. Operation engaging section 51a engaging with the lower face of engagement member 54 of inlet pressing member 32 is formed in the central portion of operation lever 51. Operation lever 51 is rotated in the counterclockwise direction of FIG. 5 by a biasing force of spring 55, normally holds operation engaging section 51a at a position where the operation engagement section is lowered, and makes inlet pressing member 32 abut against tape conveyance path 38 by a biasing force of spring 35-2. Thereby, carrier tape 900 or embossed tape 910 cannot be normally inserted from tape insertion section 21d by inlet pressing member 32.

On the other hand, when operation knob 51b provided at the rear end of operation lever 51 is raised by the operator and operation lever 51 is rotated against a biasing force of spring 55, inlet pressing member 32 is raised against a biasing force of spring 35-2 through operation engaging section 51a. Thereby, inlet pressing member 32 separates from above tape conveyance path 38, and carrier tape 900 or embossed tape 910 can be inserted from tape insertion section 21d.

Baffle plate 56 blocking tape insertion section 21d is pivotally supported by the rear portion of inlet pressing member 32. Baffle plate 56 prevents carrier tape 900 or embossed tape 910 from being inserted between tape conveyance path 38 and inlet pressing member 32. Meanwhile, baffle plate 56 is rotated while engaging with the rear portion of downstream side pressing member 33 when inlet pressing member 32 is raised, and opens tape insertion section 21d.

Stopper member 31 is provided on the downstream side of inlet pressing member 32 so as to be adjacent to the inlet pressing member. Stopper member 31 is configured such that shaft supporting section 31b formed at the central portion thereof is pivotally supported by downstream side pressing member 33. Abutting section 31a formed so as to protrude downward is formed in front of and below shaft supporting section 31b of stopper member 31. The rear end of stopper member 31 is configured as stopping section 31c.

A spring, not shown in the drawing, which biases abutting section 31a in a direction in which the abutting section abuts against tape conveyance path 38 is provided between downstream side pressing member 33 and stopper member 31. Protruding section 31d protruding upward is formed in front of and above shaft supporting section 31b of stopper member 31, and cam follower 31e is provided at the tip end of protruding section 31d. Cam section 51c formed in the front portion of operation lever 51 engagers with cam follower 31e so as to be engaged and disengaged.

Operation lever 51 is rotated in the counterclockwise direction of FIG. 5 by a biasing force of spring 55, and cam section 51c formed in operation lever 51 is separated from cam follower 31e of stopper member 31 in a state where inlet pressing member 32 is held at a position abutting against tape conveyance path 38. Thereby, stopper member 31 is rotated in the clockwise direction of FIG. 5 by a biasing force of a spring centering on shaft supporting section 31b, and makes abutting section 31a abut against tape conveyance path 38 and holds stopping section 31c at a position separated from tape conveyance path 38.

On the other hand, when operation lever 51 is rotated against the biasing force of spring 55, cam section 51c formed in operation lever 51 engages with cam follower 31e of stopper member 31 to rotate stopper member 31 against a biasing force of a spring, not shown in the drawing, in the counterclockwise direction of FIG. 5, and makes stopping section 31c abut against tape conveyance path 38. Thereby, when carrier tape 900 or embossed tape 910 is inserted from tape insertion section 21d in a state where operation lever 51 is rotated against the biasing force of spring 55, the tip end of carrier tape 900 or embossed tape 910 abuts against stopping section 31c of stopper member 31 and is stopped at a predetermined position.

Meanwhile, when first carrier tape 900A or first embossed tape 910A passes between abutting section 31a of stopper member 31 and tape conveyance path 38, abutting section 31a is raised by first carrier tape 900A or first embossed tape 910A, and stopping section 31c of stopper member 31 abuts against tape conveyance path 38. Therefore, when second carrier tape 900B or second embossed tape 910B is inserted on first carrier tape 900A or first embossed tape 910A from tape insertion section 21d by the operator in this state, the tip end of second carrier tape 900B or the second embossed tape 910B abuts stopping section 31c of stopper member 31 and is stopped. Thereby, the conveyance of second carrier tape 900B or second embossed tape 910B to the downstream is inhibited, and second carrier tape 900B or second embossed tape 910B stands by at the position.

As illustrated in FIG. 5, when carrier tape 900 or embossed tape 910 is inserted from tape insertion section 21d, first sensor 81 detecting the insertion of carrier tape 900 or embossed tape 910 is installed in feeder main body 21b. First dog 82 protruding from the upper face of tape conveyance path 38 is lowered by the insertion of carrier tape 900 or embossed tape 910, thereby turning on first sensor 81. First dog 82 is normally held at a position where the first dog protrudes from the upper face of tape conveyance path 38 by a biasing force of a spring not shown in the drawing, and is pressed downward when carrier tape 900 or embossed tape 910 is inserted.

In addition, second sensor 83 detecting the rotation of operation lever 51 and third sensor 85 operated when carrier tape 900 or embossed tape 910 is conveyed to tape conveyance path 38 on fourth sprocket 64 are installed in feeder main body 21b. Second sensor 83 is turned on by second dog 84 installed in operation lever 51. Third sensor 85 is turned on by the rotation of third dog 86.

Third dog 86 is configured to be rotatable by shaft support section 86a, formed in the central portion thereof, being pivotally supported by downstream side pressing member 33. Third dog 86 is normally biased in the counterclockwise direction of FIG. 5 by a spring not shown in the drawing. Thereby, third dog 86 is configured such that the tip end thereof abuts against the upper face of tape conveyance path 38 when carrier tape 900 or embossed tape 910 is not present in tape conveyance path 38, but abuts against the upper face of carrier tape 900 or embossed tape 910 when carrier tape 900 or embossed tape 910 is present in tape conveyance path 38. When third sensor 85 detects carrier tape 900 or embossed tape 910 by the third sensor being turned on by the rotation of third dog 86, the third sensor outputs a rotation instruction signal of lever 51 for lowering inlet pressing member 32 to control device 200. Thereby, it is possible to reliably press down carrier tape 900 or embossed tape 910 by inlet pressing member 32.

As illustrated in FIG. 4, fourth sensor 65 that detects the presence or absence of carrier tape 900 or embossed tape 910 and outputs a detection signal therefor to control section 39 is provided in feeder main body 21b on the downstream side (rear end portion side of the feeder 21) of third sprocket 63. Fourth sensor 65 is a sensor that detects a boundary portion between first carrier tape 900A or first embossed tape 910A and second carrier tape 900B or second embossed tape 910B. Fifth sensor 66 that detects the presence or absence of carrier tape 900 or embossed tape 910 and outputs a detection signal therefor to control section 39 is provided in feeder main body 21b on the upstream side (front end portion side of feeder 21) of second sprocket 62.

Lifting prevention member 28 is provided along tape conveyance path 38 between third sprocket 63 and second sprocket 62. Shaft supporting section 28a is formed at the front end of lifting prevention member 28, and shaft supporting section 28a is pivotally supported by shaft section 21c provided in feeder main body 21b so that lifting prevention member 28 is swingably installed in feeder main body 21b. Guide section 28b bent upward is formed at the rear end of lifting prevention member 28. Torsion spring 29 is installed in feeder main body 21b above lifting prevention member 28 and biases lifting prevention member 28 downward. The lower face of lifting prevention member 28 comes into close contact with the upper face of tape conveyance path 38 by torsion spring 29.

Tape peeling device 70, provided in the front upper portion of feeder main body 21b, peels off cover tape 902 from carrier tape 900 or embossed tape 910 and such that a component can be extracted from component storage sections 901c and 901d that are positioned at component pickup position 21a.

Operation of Feeder

Next, the operation of feeder 21 according to the above-described embodiment will be described with reference to FIGS. 8 to 14. Here, first carrier tape 900A or first embossed tape 910A is wound around reel 810 on the front side, and second carrier tape 900B or second embossed tape 910B is wound around reel 820 on the back side. Usually, operation lever 51 is held in the state illustrated in FIG. 8 by a biasing force of spring 55, and inlet pressing member 32 abuts against tape conveyance path 38, and baffle plate 56 is rotated by its own weight to block tape insertion section 21d.

Figure 9:
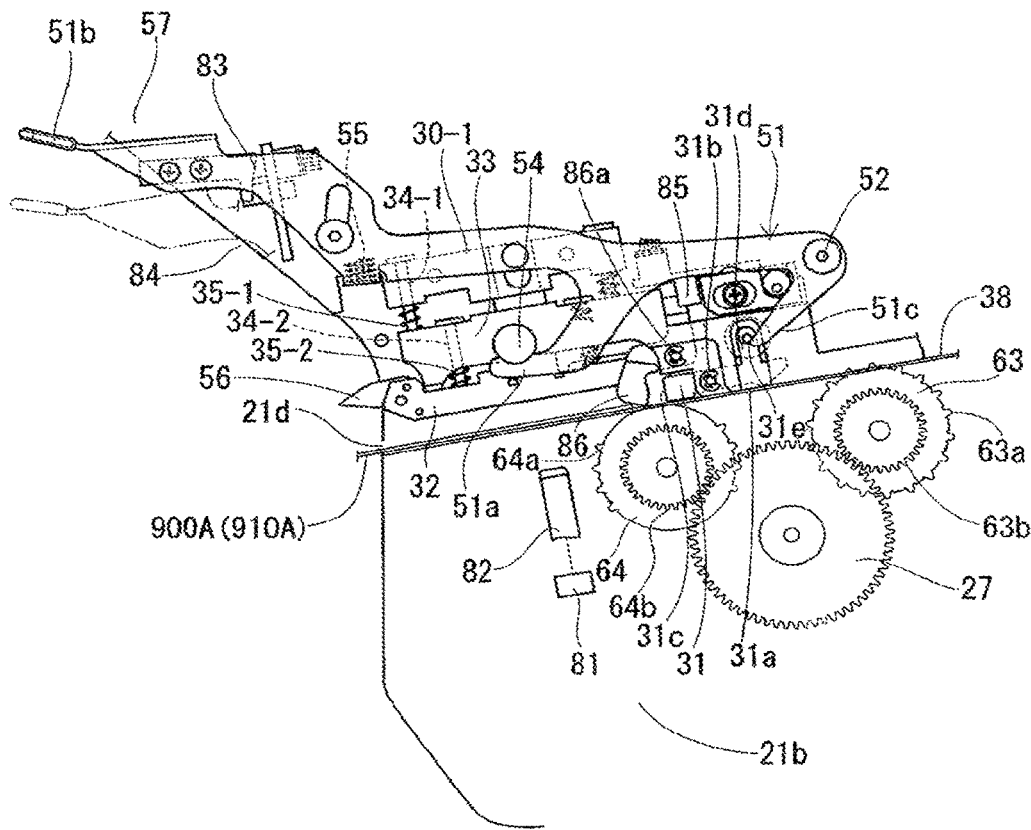
FIG. 9 is an operational state diagram illustrating a state where the operation lever is raised.

In this state, as illustrated in FIG. 9, operation knob 51b of operation lever 51 is raised by the operator. When operation lever 51 is raised, second sensor 83 is operated by second dog 84, and the operation of operation lever 51 is detected. Inlet pressing member 32 is raised through operation engaging section 51a by the rotation of operation lever 51. At this time, tape upper face biasing member 111 is configured such that the rear end portion is raised together with inlet pressing member 32 in a state where the tip end portion thereof abuts against tape lower face biasing member 110.

Thereby, inlet pressing member 32 is separated from tape conveyance path 38, and baffle plate 56 is rotated by downstream side pressing member 33. As a result, tape insertion section 21d is opened so that carrier tape 900 or embossed tape 910 can be inserted. At the same time, stopper member 31 is rotated by cam section 51c by the rotation of operation lever 51, and stopping section 31c abuts against tape conveyance path 38.

First, a case where first carrier tape 900A is inserted by the operator will be described. As illustrated in FIG. 9, the tip end of first carrier tape 900A passes through tape insertion section 21d and is inserted on tape conveyance path 38 in which groove 38A is blocked by tape lower face biasing member 110. In this manner, first carrier tape 900A is supported by tape lower face biasing member 110, and thus one side portion of first carrier tape 900A does not fall into groove 38A of tape conveyance path 38 even when first carrier tape 900A is easily bent. At this time, the tip end of first carrier tape 900A presses down first dog 82 while abutting against first dog 82, and thus first sensor 81 detects that first carrier tape 900A has been inserted.

Figure 10:
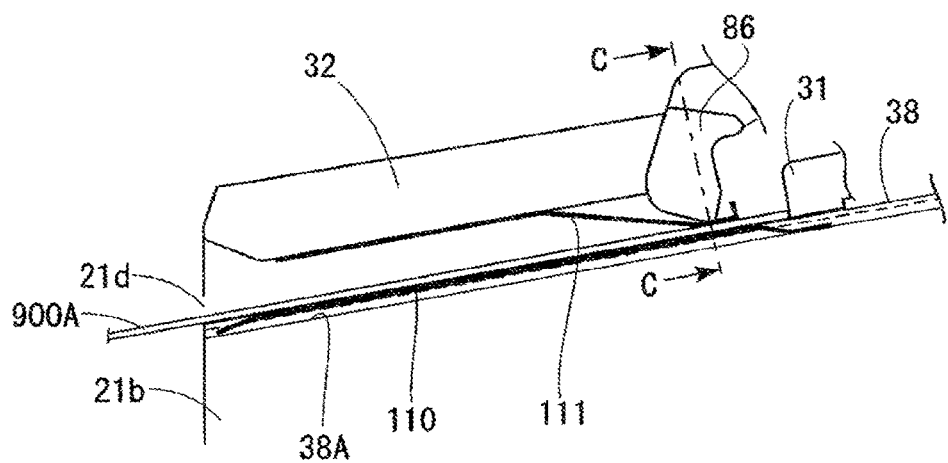
FIG. 10 is an enlarged view when the carrier tape is inserted into a tape conveyance path between the tape lower face biasing member and the tape upper face biasing member illustrated in FIG. 9.
Figure 11:
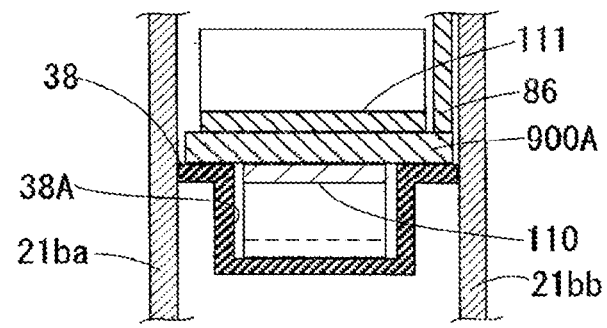
FIG. 11 is a cross-sectional view taken along line C-C in the vicinity of the tape lower face biasing member and the tape upper face biasing member illustrated in FIG. 10.

As illustrated in FIGS. 10 and 11, the tip end of first carrier tape 900A pushes up tape upper face biasing member 111 abutting against tape lower face biasing member 110, enters between tape lower face biasing member 110 and tape upper face biasing member 111, and is inserted to a predetermined position abutting against stopping section 31c of stopper member 31. At this time, the tip end of first carrier tape 900A rotates third dog 86 while abutting against third dog 86, and thus third sensor 85 detects that first carrier tape 900A has been inserted into a predetermined position, and outputs a rotation instruction signal of lever 51 for lowering the inlet pressing member 32 to control device 200.

Next, a case where first embossed tape 910A is inserted by the operator will be described. As illustrated in FIG. 9, the tip end of first embossed tape 910A passes through tape insertion section 21d and is inserted on tape conveyance path 38. However, at this time, tape lower face biasing member 110 is pressed down to the bottom face side of groove 38A by embossed section 904a (see FIGS. 12 and 13), and thus moves along tape conveyance path 38. At this time, the tip end of first embossed tape 910A presses down first dog 82 while abutting against first dog 82, and thus first sensor 81 detects that first embossed tape 910A has been inserted.

Figure 12:
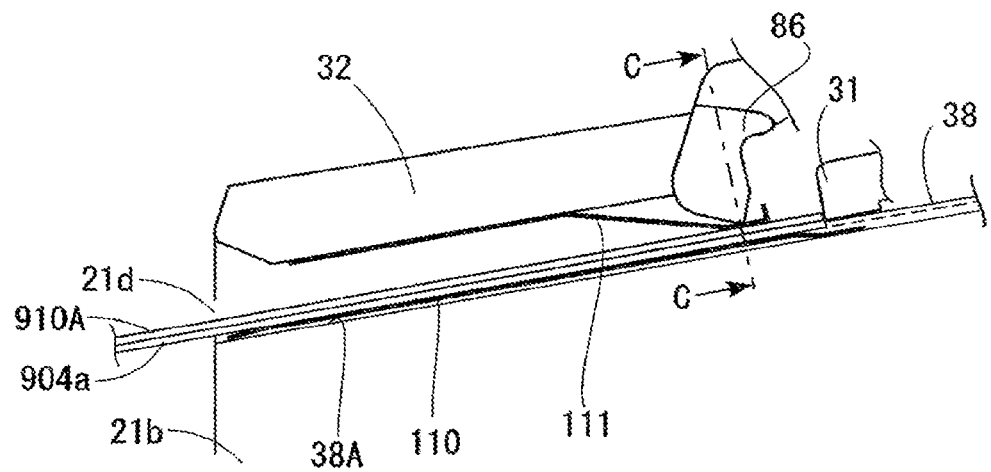
FIG. 12 is an enlarged view when the embossed tape is inserted into the tape conveyance path between the tape lower face biasing member and the tape upper face biasing member illustrated in FIG. 9.
Figure 13:
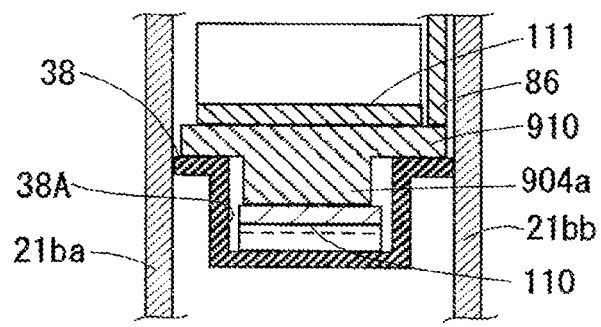
FIG. 13 is a cross-sectional view taken along line C-C in the vicinity of the tape lower face biasing member and the tape upper face biasing member illustrated in FIG. 12.

As illustrated in FIGS. 12 and 13, the tip end of first embossed tape 910A pushes up tape upper face biasing member 111 abutting against tape lower face biasing member 110, enters between tape lower face biasing member 110 and tape upper face biasing member 111, and is inserted to a predetermined position abutting against stopping section 31c of stopper member 31. At this time, the tip end of first embossed tape 910A rotates third dog 86 while abutting against third dog 86, and thus third sensor 85 detects that first embossed tape 910A has been inserted into a predetermined position, and outputs a rotation instruction signal of lever 51 for lowering inlet pressing member 32 to control device 200.

The processing proceeds to the next operation. The subsequent operations are not different with carrier tape 900 and embossed tape 910, and thus a description of embossed tape 910 will be omitted and is given as carrier tape 900. As illustrated in FIG. 9, when first carrier tape 900A is inserted to a position abutting against stopping section 31c, the operation of operation lever 51 is canceled, and operation lever 51 is rotated and returns to the original position indicated by a two-dot chain line of FIG. 9 by a biasing force of spring 55. Inlet pressing member 32 is lowered toward tape conveyance path 38 by the rotation and return of operation lever 51, and inserted first carrier tape 900A is pressed toward tape conveyance path 38.

Figure 14:
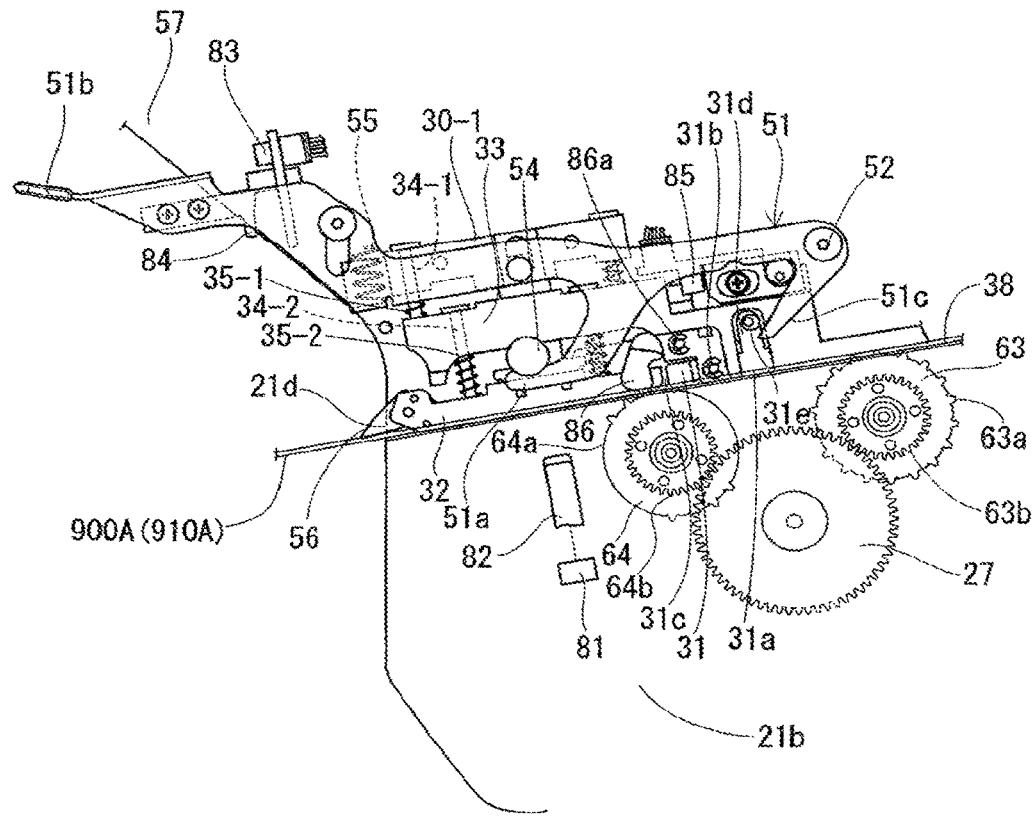
FIG. 14 is an operational state diagram illustrating a state where the operation lever is lowered to convey the carrier tape.

As illustrated in FIG. 14, when the insertion of first carrier tape 900A and the rotation and return to the original position of operation lever 51 are detected (second sensor 83 is turned off), second servomotor 23 is driven, and third and fourth sprockets 63 and 64 are rotated. Thereby, engagement protrusion 64a of fourth sprocket 64 engages with engagement hole 901b of first carrier tape 900A, and first carrier tape 900A is conveyed to third sprocket 63 side by fourth sprocket 64.

Downstream side pressing member 33 is raised against a biasing force of spring 35-1 by first carrier tape 900A in association with the conveyance of first carrier tape 900A by fourth sprocket 64, and first carrier tape 900A is conveyed between downstream side pressing member 33 and tape conveyance path 38.

At this time, engagement protrusion 64a of fourth sprocket 64 is formed on only a portion of the outer circumference of fourth sprocket 64, first carrier tape 900A is intermittently moved to third sprocket 63 side when engagement protrusion 64a engages with engagement hole 901b of first carrier tape 900A. As a result, first carrier tape 900A is not rapidly drawn to the third sprocket 63 side. Meanwhile, when downstream side pressing member 33 is raised by first carrier tape 900A, shaft support sections 31b and 86a of the respective stopper members 31 and third dog 86 are integrally raised.

When engagement hole 901b formed in first carrier tape 900A conveyed by fourth sprocket 64 engages with engagement protrusion 63a of third sprocket 63, first carrier tape 900A is conveyed to second sprocket 62 side by third sprocket 63. Since engagement protrusion 63a is formed across the entire circumference of third sprocket 63, first carrier tape 900A is conveyed to the second sprocket 62 side in a short period of time.

Further, the tip end of first carrier tape 900A enters below lifting prevention member 28 from between guide section 28b and tape conveyance path 38. The tip end of first carrier tape 900A is prevented from being lifted from tape conveyance path 38 by lifting prevention member 28 and is conveyed toward second sprocket 62. When fifth sensor 66 detects the tip end of first carrier tape 900A conveyed by third sprocket 63, first servomotor 22 and second servomotor 23 intermittently rotate sprockets 61 to 64 at a pitch interval of a component.

When engagement hole 901b formed in first carrier tape 900A engages with engagement protrusion 62a of second sprocket 62, first carrier tape 900A is transmitted to tape peeling device 70 by second sprocket 62, and cover tape 902 is peeled off from first carrier tape 900A by tape peeling device 70. When engagement hole 901b formed in first carrier tape 900A engages with engagement protrusion 61a of first sprocket 61, components stored in first carrier tape 900A by first sprocket 61 are sequentially positioned at component pickup position 21a.

In a case where first carrier tape 900A is conveyed by feeder 21, first carrier tape 900A presses abutting section 31a of stopper member 31 so that stopper member 31 is rotated against a biasing force of spring 36 as illustrated in FIG. 14. Thereby, stopping section 31c of stopper member 31 comes into contact with the upper face of first carrier tape 900A.

In this state, as described above, operation lever 51 is rotated (second sensor 83 is turned on) so that the tip end of second carrier tape 900B is inserted between first carrier tape 900A and inlet pressing member 32 through tape insertion section 21d. Then, the tip end of second carrier tape 900B abuts against stopping section 31c of stopper member 31, and second carrier tape 900B is stopped at that position.

Thereby, the conveyance of second carrier tape 900B to the downstream is inhibited, and second carrier tape 900B stands by at the position. When second carrier tape 900B is inserted into a position abutting against stopping section 31c of stopper member 31, third dog 86 is operated by second carrier tape 900B, and thus the insertion of second carrier tape 900B is detected by third sensor 85.

When the operation of operation lever 51 is canceled after second carrier tape 900B is inserted, operation lever 51 returns to the original position. However, first carrier tape 900A presses abutting section 31a of stopper member 31, and thus the stopped state of second carrier tape 900B is continued by stopping section 31c of stopper member 31. Meanwhile, even if there is an attempt to insert second carrier tape 900B into tape insertion section 21d without rotating operation lever 51, the insertion of second carrier tape 900B is inhibited by baffle plate 56 abutting against the upper face of first carrier tape 900A (see FIG. 9).

When the rear end of first carrier tape 900A is conveyed to a side closer to the downstream side than the tip end of second carrier tape 900B, engagement hole 901b formed in second carrier tape 900B engages with engagement protrusion 64a of fourth sprocket 64. Thereafter, second carrier tape 900B enters a gap between tape conveyance path 38 and stopper member 31 which is formed by first carrier tape 900A, and is conveyed toward second sprocket 62. Meanwhile, when the tip end of second carrier tape 900B raises abutting section 31a, stopper member 31 is rotated again against a biasing force of spring 36 as described above, and new entering of carrier tape 900 is inhibited.

Effects

Feeder 21 according to the above-described embodiment includes feeder main body 21b, tape conveyance path 38, and fourth sprocket 64. In feeder main body 21b, tape insertion section 21d for receiving carrier tape 910, in which component storage section 901d storing multiple components is formed so as to protrude downward, and carrier tape 900 in which the component storage section 901c not protruding downward is formed, is formed in the rear portion of feeder main body 21b. Tape conveyance path 38 is provided between the both side walls 21ba and 21bb of feeder main body 21b so as to communicate with tape insertion section 21d in order to convey carrier tapes 900 and 910 toward the front side from the back side. Fourth sprocket 64 is rotatably provided in feeder main body 21b, includes the engagement protrusion 64a engageable with engagement holes 301b of carrier tapes 900 and 910 inserted from tape insertion section 21d, and transmits carrier tapes 900 and 910 along tape conveyance path 38.

Groove 38A for allowing passing of component storage section 901d during the conveyance of carrier tapes 900 and 910 having component storage section 901d protruding is formed in tape conveyance path 38. Groove 38A is provided with tape lower face biasing member 110 which is pressed by the lower face of carrier tape 910 and is deformed downward when carrier tape 910 has component storage section 901d protruding, and biases the lower face of carrier tape 900 when carrier tape 900 has component storage section 901c not protruding, until carrier tapes 900 and 910 inserted from tape insertion section 21d reach fourth sprocket 64.

Thereby, even when carrier tape 900 having the component storage section 901c not protruding is easily bent, the lower face of carrier tape 900 is supported by tape lower face biasing member 110 when carrier tape 900 is inserted into tape conveyance path 38 from tape insertion section 21d. Accordingly, it is possible to prevent one side portion of carrier tape 900 from falling into groove 38A of tape conveyance path 38.

In addition, feeder 21 includes inlet pressing member 32 and tape upper face biasing member 111. Inlet pressing member 32 is provided in feeder main body 21b, and presses carrier tapes 900 and 910 inserted from tape insertion section 21d toward tape conveyance path 38. Tape upper face biasing member 111 is provided in inlet pressing member 32 so as to face tape lower face biasing member 110, and biases the upper faces of carrier tapes 900 and 910 inserted from tape insertion section 21d. Thereby, carrier tapes 900 and 910 can smoothly move on tape conveyance path 38 because the upper and lower faces of the carrier tapes are sandwiched between tape lower face biasing member 110 and tape upper face biasing member 111.

In addition, tape lower face biasing member 110 and tape upper face biasing member 111 are configured by elastic bodies, and the elastic modulus of tape lower face biasing member 110 is lower than the elastic modulus of tape upper face biasing member 111. Thus, carrier tape 900 can wove along the upper face of tape conveyance path 38 without being lifted from the upper face of tape conveyance path 38 when the upper and lower faces of carrier tape 900 are sandwiched between tape lower face biasing member 110 and tape upper face biasing member 111. In addition, embossed tape 910 can move along the upper face of tape conveyance path 38 without being lifted from the upper face of tape conveyance path 38 in a state where tape lower face biasing member 110 is deformed downward by embossed section 904a when the upper and lower faces of embossed tape 910 are sandwiched between tape lower face biasing member 110 and tape upper face biasing member 111.

In addition, feeder 21 includes third sensor 85 and third dog 86 which are provided in feeder main body 21b on a side closer to the downstream side than fourth sprocket 64 in tape conveyance path 38 and detect carrier tapes 900 and 910 by the tip ends of carrier tapes 900 and 910, inserted from tape insertion section 21d, abutting against third sensor 85 and third dog 86. Tape upper face biasing member 111 is provided up to at least the arrangement positions of third sensor 85 and third dog 86, and thus it is possible to reliably make the tip ends of carrier tapes 900 and 910 abut against third sensor 85 and third dog 86.

In addition, feeder 21 includes rotatable lever 51 which is provided in feeder main body 21b and raises inlet pressing member 32 when carrier tapes 900 and 910 are inserted from tape insertion section 21d. Third sensor 85 and third dog 86 output a rotation instruction signal of lever 51 for lowering inlet pressing member 32 when detecting carrier tapes 900 and 910, and thus it is possible to reliably press carrier tapes 900 and 910 by inlet pressing member 32.

Others

In the above-described embodiment, a configuration has been adopted in which tape lower face biasing member 110 and tape upper face biasing member 111 are provided, but a configuration in which only tape lower face biasing member 110 is provided may be adopted. In addition, tape upper face biasing member 111 is configured such that the front end portion thereof is bent downward in an L shape, and thus biases the upper face of carrier tape 900 or embossed tape 910 by the tip end portion of tape upper face biasing member 111. However, tape upper face biasing member 111 may be configured to bias the upper face of carrier tape 900 by the front end portion of tape upper face biasing member 111 in a wide range, as a configuration in which tape upper face biasing member 111 is bent downward from the rear end portion side thereof in an L shape depending on the easiness of bending of carrier tape 900, and may be configured to prevent carrier tape 900 from being twisted in the width direction.

In addition, tape lower face biasing member 110 and tape upper face biasing member 111 are constituted by a belt-shaped plate spring, but may be constituted by an elastic body, such as a compression coil spring or a rubber material, to which a plate material is attached.

The disclosure is not limited to the configuration described in the above-described embodiment, and various configurations may be adopted without departing from the scope of the disclosure.

REFERENCE SIGNS LIST

21: feeder, 21b: feeder main body, 21ba, 21bb: side wall, 21d: tape insertion section, 32: inlet pressing member, 38: tape conveyance path, 38A: groove, 51: operation lever, 64: fourth sprocket, 64a: engagement protrusion, 85: third sensor, 86: third dog, 100: component mounting machine, 110: tape lower face biasing member, 111: tape upper face biasing member, 900: carrier tape, 910: embossed tape, 901a: through hole, 901b: engagement hole, 901c, 901d: component storage section

The invention claimed is:

1. A feeder comprising:
a feeder main body which has a tape insertion section formed in a rear portion of the feeder main body, the tape insertion section being configured to receive a carrier tape in which a component storage section storing a plurality of components is formed so as to protrude downward and a carrier tape in which a component storage section not protruding downward is formed;
a tape conveyance path which is provided between both side walls of the feeder main body so as to communicate with the tape insertion section in order to convey the carrier tapes toward a front side from a back side; and
a rear side sprocket which is rotatably provided in the feeder main body, has an engageable engagement protrusion in an engagement hole of the carrier tape inserted from the tape insertion section, and transmits the carrier tape along the tape conveyance path,
wherein a groove for allowing passing of the component storage section during the conveyance of the carrier tape having the component storage section protruding is formed in the tape conveyance path, and
wherein the groove is provided with a tape lower face biasing member which is pressed by a lower face of the carrier tape and is deformed downward when the carrier tape has the component storage section protruding, and biases the lower face of the carrier tape when the carrier tape has the component storage section not protruding, until the carrier tape inserted from the tape insertion section reaches the rear side sprocket.

2. The feeder according to claim 1, further comprising:
an inlet pressing member which is provided in the feeder main body and presses the carrier tape inserted from the tape insertion section toward the tape conveyance path; and
a tape upper face biasing member which is provided in the inlet pressing member so as to face the tape lower face biasing member, and biases the upper face of the carrier tape inserted from the tape insertion section.

3. The feeder according to claim 2,
wherein the tape lower face biasing member and the tape upper face biasing member are made of elastic bodies, and
wherein an elastic modulus of the tape lower face biasing member is lower than an elastic modulus of the tape upper face biasing member.

4. The feeder according to claim 2, further comprising:
a detection device which is provided in the feeder main body on a side closer to a downstream side of conveyance than the rear side sprocket in the tape conveyance path, and detects the carrier tape by a tip end of the carrier tape, inserted from the tape insertion section, abutting against the detection device,
wherein the tape upper face biasing member is provided up to at least an arrangement position of the detection device.

5. The feeder according to claim 4, further comprising:
a rotatable lever which is provided in the feeder main body and raises the inlet pressing member when the carrier tape is inserted from the tape insertion section,
wherein the detection device outputs a rotation instruction signal of the lever for lowering the inlet pressing member when detecting the carrier tape.

* * * * *